(12) United States Patent
Takashima et al.

(10) Patent No.: US 12,082,367 B2
(45) Date of Patent: Sep. 3, 2024

(54) TANK AND COOLING UNIT

(71) Applicant: Nidec Corporation, Kyoto (JP)

(72) Inventors: Naoyuki Takashima, Kyoto (JP);
Takehito Tamaoka, Kyoto (JP);
Toshihiko Tokeshi, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 273 days.

(21) Appl. No.: 17/570,405

(22) Filed: Jan. 7, 2022

(65) Prior Publication Data

US 2022/0232731 A1 Jul. 21, 2022

(30) Foreign Application Priority Data

Jan. 19, 2021 (JP) ................................. 2021-006712

(51) Int. Cl.
*H05K 7/20* (2006.01)
(52) U.S. Cl.
CPC ..... *H05K 7/20254* (2013.01); *H05K 7/20272* (2013.01)
(58) Field of Classification Search
CPC ............ H05K 7/20254; H05K 7/20272; F24F 2005/0025; F25B 2400/16; F25B 45/00
See application file for complete search history.

(56) References Cited

U.S. PATENT DOCUMENTS

| 6,843,311 | B2 * | 1/2005 | Evans ..................... F28D 9/005 165/167 |
| 7,028,761 | B2 * | 4/2006 | Lee ......................... H01L 23/473 174/15.1 |
| 7,325,591 | B2 * | 2/2008 | Duan ..................... H01L 23/473 257/E23.098 |
| 7,423,875 | B2 * | 9/2008 | Huang .................. H01L 23/473 361/679.48 |
| 11,452,243 | B2 * | 9/2022 | Lyon .................. H05K 7/20836 |
| 2003/0233942 | A1 * | 12/2003 | Konishi .................... F15B 1/26 96/216 |
| 2013/0020058 | A1 * | 1/2013 | Suzuki ............... H05K 7/20772 165/104.31 |
| 2019/0116694 | A1 * | 4/2019 | Lyon .................. H05K 7/20836 |
| 2020/0227341 | A1 * | 7/2020 | Neal ......................... F28F 3/12 |
| 2021/0352830 | A1 * | 11/2021 | Varela Benitez ......... G06F 1/20 |
| 2022/0034563 | A1 * | 2/2022 | Matsuda ............... F25B 43/006 |
| 2022/0197353 | A1 * | 6/2022 | Chen .................. H05K 7/20509 |

\* cited by examiner

*Primary Examiner* — Stephen S Sul
(74) *Attorney, Agent, or Firm* — Keating & Bennett, LLP

(57) ABSTRACT

A tank includes a housing, a tank chamber inflow hole, a tank chamber outflow hole, and a protruding flow path. The housing includes a tank chamber. Liquid flows into the tank chamber from the tank chamber inflow hole. Liquid in the tank chamber flows out from the tank chamber outflow hole. The protruding flow path is connected to the tank chamber outflow hole, and protrudes into the tank chamber from the tank chamber outflow hole. With this arrangement, outflow of gas from the tank chamber through which liquid flows is suppressed.

13 Claims, 9 Drawing Sheets

TANK AND COOLING UNIT

CROSS-REFERENCE TO RELATED APPLICATIONS

The present application claims priority under 35 U.S.C. § 119 to Japanese Patent Application No. 2021-006712, filed on Jan. 19, 2021, the entire contents of which are hereby incorporated herein by reference.

1. Field of the Invention

The present disclosure relates to a tank and a cooler.

2. Background

A liquid feeder that feeds liquid using a pump is used in various apparatuses. In one example, a liquid feeder is used in a cooling apparatus that circulates a refrigerant for cooling a heat generating component. In order to prevent the pump from idling, a tank that prevents a refrigerant containing gas from flowing into the pump has been studied.

Conventionally, there has been known a refrigerant storage tank in which a restraining plate facing an outflow port in a tank main body is disposed near the outflow port. In the conventional refrigerant storage tank, the restraining plate can prevent the refrigerant from flowing directly from the inflow port to the outflow port, so that the gas in the refrigerant can be prevented from flowing into the pump.

However, even in the conventional refrigerant storage tank, the gas in the tank main body may enter the outflow port, and the gas may flow into the pump. For example, when the orientation or attitude of the refrigerant storage tank is changed and the outflow port of the tank main body is positioned vertically above, the refrigerant in the tank main body gathers vertically below the tank main body, and as a result, the gas in the tank main body gathers near the outflow port of the tank main body positioned vertically above. In this case, the gas in the vicinity of the outflow port may flow out from the outflow port.

SUMMARY

An example embodiment of a tank of the present disclosure includes a housing including a tank chamber, a tank chamber inflow hole through which liquid flows into the tank chamber, a tank chamber outflow hole through which the liquid flows out from the tank chamber, and a protruding flow path connected to the tank chamber outflow hole and protruding from the tank chamber outflow hole into the tank chamber.

An example embodiment of a cooler of the present disclosure includes the tank described above, and a cover on the tank chamber outflow hole side of the tank. At least the tank and the cover define a second flow path, and liquid flowing out from the tank chamber outflow hole of the tank flows in the second flow path along a direction different from a direction in which the protruding flow path extends.

The above and other elements, features, steps, characteristics and advantages of the present disclosure will become more apparent from the following detailed description of the example embodiments with reference to the attached drawings.

DETAILED DESCRIPTION

Figure 1:
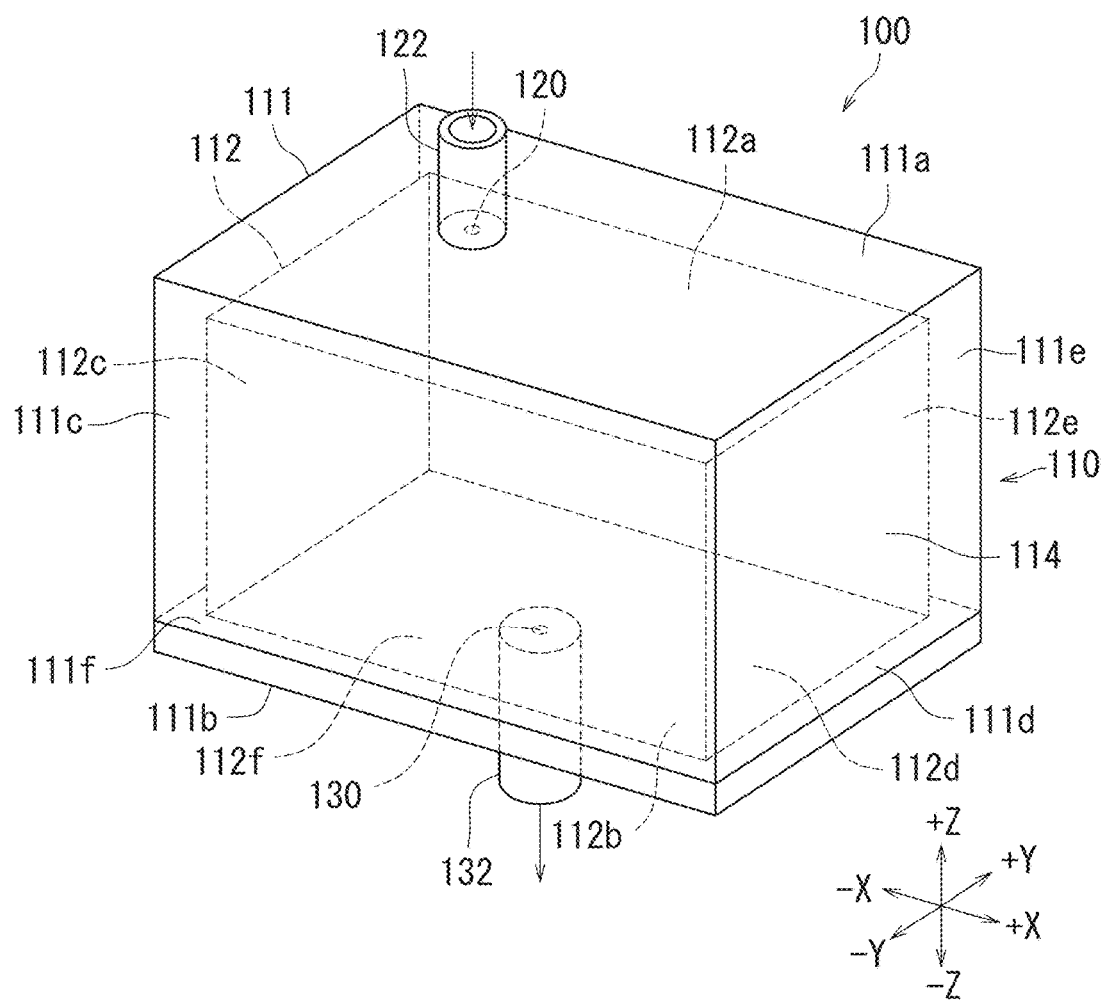
FIG. 1 is a schematic perspective view of a tank of a first example embodiment of the present disclosure.

Hereinafter, example embodiments of the present disclosure will be described with reference to the accompanying drawings. Note that in the drawings, the same or corresponding parts will be denoted by the same reference symbols and description thereof will not be repeated. The present specification may refer to an X-axis, a Y-axis, and a Z-axis, orthogonal to each other, to facilitate the understanding of the disclosure. Typically, any one of the X-axis, the Y-axis, and the Z-axis is parallel to the vertical direction, and the remaining two are parallel to the horizontal direction. Further, a direction on one side in the X axis is defined as a +X direction, and a direction on the other side is defined as a −X direction. Further, a direction on one side in the Y axis is defined as a +Y direction, and a direction on the other side is defined as a −Y direction. Further, a direction on one side in the Z axis is defined as a +Z direction, and a direction on the other side is defined as a −Z direction. However, the orientations of the X axis, the Y axis, and the Z axis are not intended to limit the orientation when the cooler according to the present disclosure is used.

Next, a tank 100 of a first example embodiment will be described with reference to FIG. 1. FIG. 1 is a schematic perspective view of the tank 100.

The tank 100 can store liquid. The liquid stored in the tank 100 may be water. Alternatively, the liquid may be a mixed liquid. For example, the mixed liquid may contain water and propylene glycol.

Liquid flows into the tank 100. The liquid in the tank 100 flows out of the tank 100. The tank 100 is used for circulation of liquid. The tank 100 can temporarily store liquid circulating through the tank 100.

As illustrated in FIG. 1, the tank 100 includes a housing 110, a tank chamber inflow hole 120, and a tank chamber outflow hole 130. The housing 110 has a tank chamber 114 which is a hollow part. The tank chamber 114 constitutes an internal space of the housing 110. The tank chamber 114 stores the liquid flowing into the tank 100.

Here, the outer shape of the housing 110 is a substantially rectangular parallelepiped shape. The housing 110 extends in the X direction, and the longitudinal direction of the housing 110 is the X direction. The housing 110 has an outer peripheral surface 111 and an inner peripheral surface 112.

The outer peripheral surface 111 of the housing 110 has a first outer main surface 111a, a second outer main surface 111b, a first outer side surface 111c, a second outer side surface 111d, a third outer side surface 111e, and a fourth outer side surface 111f. The first outer side surface 111c and the second outer side surface 111d each are connected to the first outer main surface 111a and the second outer main surface 111b. The third outer side surface 111e and the fourth outer side surface 111f each are connected to the first outer main surface 111a, the second outer main surface 111b, the first outer side surface 111c, and the second outer side surface 111d. The first outer main surface 111a is located on the +Z direction side, and the second outer main surface 111b is located on the −Z direction side. The first outer side surface 111c is located on the −X direction side, and the second outer side surface 111d is located on the +X direction side. The third outer side surface 111e is located on the +Y direction side, and the fourth outer side surface 111f is located on the −Y direction side. Here, the first outer main surface 111a, the second outer main surface 111b, the first outer side surface 111c, the second outer side surface 111d, the third outer side surface 111e, and the fourth outer side surface 111f are all flat surfaces.

The inner peripheral surface 112 of the housing 110 has a first inner main surface 112a, a second inner main surface 112b, a first inner side surface 112c, a second inner side surface 112d, a third inner side surface 112e, and a fourth inner side surface 112f. The first inner side surface 112c and the second inner side surface 112d each are connected to the first inner main surface 112a and the second inner main surface 112b. The third inner side surface 112e and the fourth inner side surface 112f each are connected to the first inner main surface 112a, the second inner main surface 112b, the first inner side surface 112c, and the second inner side surface 112d. The first inner main surface 112a is located on the +Z direction side, and the second inner main surface 112b is located on the −Z direction side. The first inner side surface 112c is located on the −X direction side, and the second inner side surface 112d is located on the +X direction side. The third inner side surface 112e is located on the +Y direction side, and the fourth inner side surface 112f is located on the −Y direction side. Here, the first inner main surface 112a, the second inner main surface 112b, the first inner side surface 112c, the second inner side surface 112d, the third inner side surface 112e, and the fourth inner side surface 112f are all flat surfaces.

Here, the tank chamber inflow hole 120 is located on the +Z direction side with respect to the tank chamber 114. The tank chamber inflow hole 120 is a through hole connecting the first outer main surface 111a and the first inner main surface 112a. The tank chamber outflow hole 130 is located on the −Z direction side with respect to the tank chamber 114. The tank chamber outflow hole 130 is a through hole connecting the second inner main surface 112b and the second outer main surface 111b.

Liquid flows into the tank chamber 114 through the tank chamber inflow hole 120. The liquid in the tank chamber 114 flows out through the tank chamber outflow hole 130.

Here, the tank chamber 114 is a substantially rectangular parallelepiped shape. The tank chamber 114 extends in the X direction, and the longitudinal direction of the tank chamber 114 is the X direction. The tank chamber 114 is surrounded by the first inner main surface 112a, the second inner main surface 112b, the first inner side surface 112c, the second inner side surface 112d, the third inner side surface 112e, and the fourth inner side surface 112f.

An inflow attachment port 122 connected to the tank chamber inflow hole 120 is disposed outside the housing 110. The inflow attachment port 122 is located on the +Z direction side with respect to the first outer main surface 111a of the housing 110. The inflow attachment port 122 has a cylindrical shape. The inflow attachment port 122 is disposed to surround the tank chamber inflow hole 120. Here, the inner diameter (length in the XY plane) of the inflow attachment port 122 is larger than the hole diameter (length in the XY plane) of the tank chamber inflow hole 120. However, the inner diameter of the inflow attachment port 122 may be substantially equal to the hole diameter of the tank chamber inflow hole 120. A pipe (not shown) through which liquid flows is attached to the inflow attachment port 122.

Further, an outflow attachment port 132 connected to the tank chamber outflow hole 130 is disposed outside the housing 110. The outflow attachment port 132 is located on the −Z direction side with respect to the second outer main surface 111b of the housing 110. The outflow attachment port 132 has a cylindrical shape. The outflow attachment port 132 is disposed to surround the tank chamber outflow hole 130. The tank chamber outflow hole 130 is located at the center of the second inner main surface 112b. The inner diameter (length in the XY plane) of the outflow attachment port 132 is larger than the hole diameter (length in the XY plane) of the tank chamber outflow hole 130. However, the inner diameter of the outflow attachment port 132 may be substantially equal to the hole diameter of the tank chamber outflow hole 130. A pipe (not illustrated) through which liquid flows is attached to the outflow attachment port 132.

Typically, the hole diameter (length in the XY plane) of the tank chamber outflow hole 130 is substantially equal to the hole diameter (length in the XY plane) of the tank chamber inflow hole 120. The inner diameter (length in the XY plane) of the outflow attachment port 132 is substantially equal to the inner diameter (length in the XY plane) of the inflow attachment port 122.

Here, the tank 100 has a symmetrical structure with respect to the XZ plane located at the center portion along the Y direction except for the tank chamber inflow hole 120 and the inflow attachment port 122. However, the tank 100 may not have a symmetrical structure.

Figure 2A:
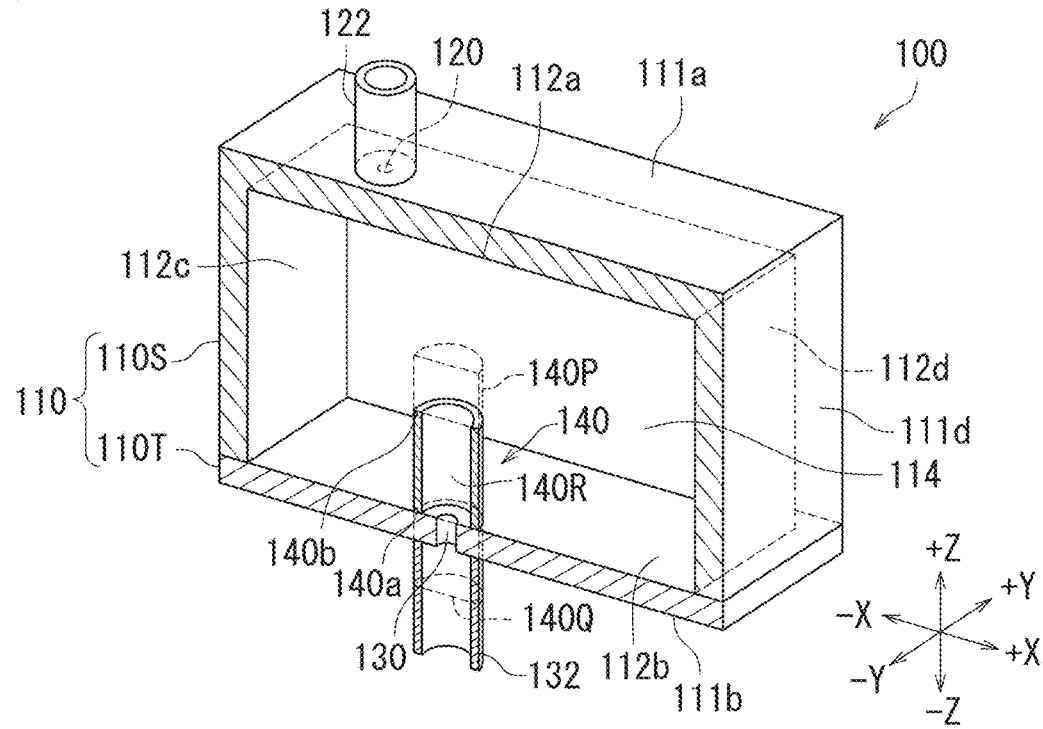
FIG. 2A is a schematic cross-sectional perspective view of the tank of the first example embodiment.

Next, the tank 100 of the first example embodiment will be described with reference to FIGS. 1 to 2B. FIG. 2A is a schematic cross-sectional perspective view of the tank 100 of the first example embodiment, and FIG. 2B is a schematic cross-sectional view of the tank 100 of the first example embodiment.

Figure 2B:
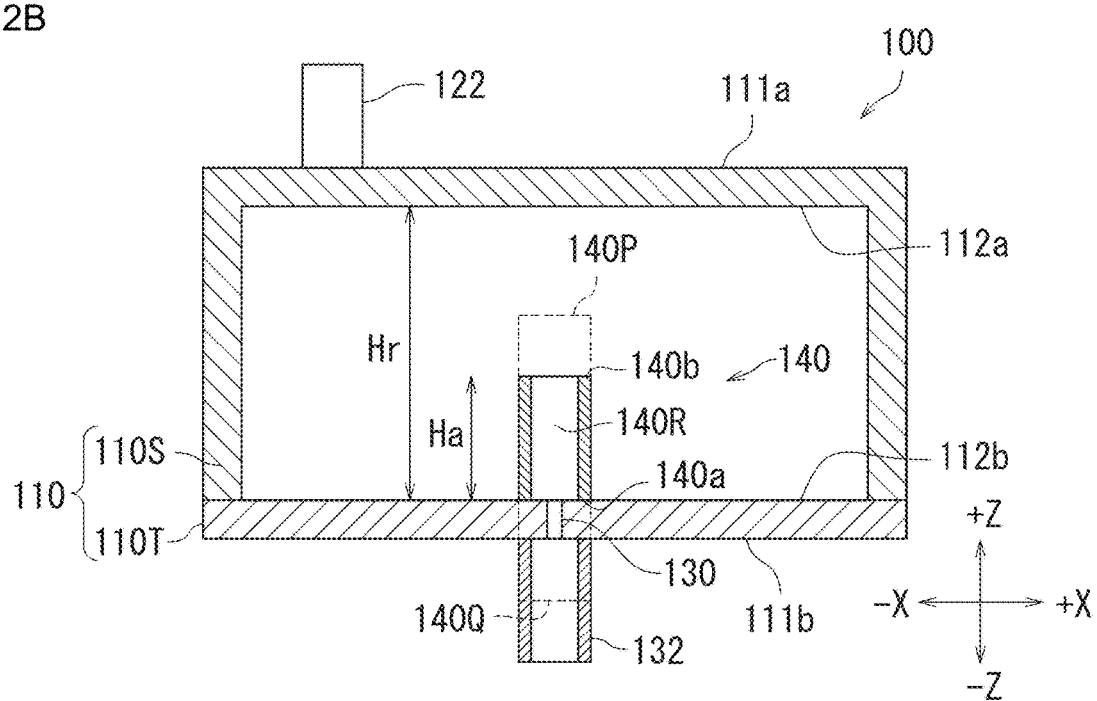
FIG. 2B is a schematic cross-sectional view of the tank of the first example embodiment.

As illustrated in FIGS. 2A and 2B, the tank 100 further includes a protruding flow path 140 in addition to the housing 110, the tank chamber inflow hole 120, and the tank chamber outflow hole 130. In the tank 100 of the first example embodiment, the protruding flow path 140 has a cylindrical shape. The protruding flow path 140 has a through hole extending in the Z direction. The outer peripheral surface and the inner peripheral surface of the protruding flow path 140 each have a cylindrical shape. However, the protruding flow path 140 may have a tubular shape, and the outer peripheral surface and the inner peripheral surface of the protruding flow path 140 may each have a rectangular parallelepiped shape. The combination of the outer peripheral surface and the inner peripheral surface of the protruding flow path 140 may be arbitrary. FIGS. 2A and 2B each show a cross section along the center of the protruding flow path 140 having a cylindrical shape. The housing 110 has the tank chamber 114. Liquid flows into the tank chamber 114 from the tank chamber inflow hole 120. Liquid in the tank chamber 114 flows out through the tank chamber outflow hole 130.

The protruding flow path 140 is connected to the tank chamber outflow hole 130. The protruding flow path 140 protrudes from the tank chamber outflow hole 130 into the tank chamber 114. Specifically, the protruding flow path 140 protrudes in the +Z direction from the second inner main surface 112b toward the inside of the tank chamber 114.

The protruding flow path 140 has a first end 140a and a second end 140b. The first end 140a is located on the tank chamber outflow hole 130 side. The second end 140b is located on the side opposite to the tank chamber outflow hole 130.

The protruding flow path 140 has a flow path inlet 140P, a flow path outlet 140Q, and a first flow path 140R. The flow path inlet 140P is located on the +Z direction side with respect to the second end 140b of the protruding flow path 140. The liquid in the flow path inlet 140P passes through the first flow path 140R and flows to the flow path outlet 140Q. The flow path outlet 140Q is located on the −Z direction side with respect to the first end 140a of the protruding flow path 140. The tank chamber outflow hole 130 is located in the flow path outlet 140Q. Here, the outflow attachment port 132 is disposed at the flow path outlet 140Q. The first flow path 140R connects the flow path inlet 140P and the flow path outlet 140Q.

The outflow attachment port 132 has a cylindrical shape. The outflow attachment port 132 faces the protruding flow path 140 via the tank chamber outflow hole 130. Typically, the inner diameter (length in the XY plane) of the protruding flow path 140 is substantially equal to the inner diameter (length in the XY plane) of the outflow attachment port 132. However, the inner diameter of the protruding flow path 140 may be different from the inner diameter of the outflow attachment port 132.

The tank chamber outflow hole 130 is a through hole connecting the second inner main surface 112b and the second outer main surface 111b. The tank chamber outflow hole 130 is surrounded by a protruding flow path 140 protruding in the +Z direction from the second inner main surface 112b. Therefore, in the tank 100 shown in FIGS. 2A and 2B, even if the orientation or attitude of the tank 100 is changed such that the second outer main surface 111b of the tank 100 faces vertically upward in a state where the gas is accumulated together with the liquid in the tank chamber 114, the gas in the tank chamber 114 cannot reach the flow path inlet 140P and hardly directly enters the protruding flow path 140. Therefore, according to the tank 100 of the present example embodiment, the protruding flow path 140 can suppress gas from entering the tank chamber outflow hole 130 regardless of the attitude of the tank 100.

The housing 110 includes a first component 110S and a second component 110T. The second component 110T constitutes the tank chamber 114 together with the first component 110S. The first component 110S has the tank chamber inflow hole 120 and the inflow attachment port 122. The first component 110S has the first outer main surface 111a, the first outer side surface 111c, the second outer side surface 111d, the third outer side surface 111e, the fourth outer side surface 111f, the first inner main surface 112a, the first inner side surface 112c, the second inner side surface 112d, the third inner side surface 112e, and the fourth inner side surface 112f.

The second component 110T has the tank chamber outflow hole 130, the outflow attachment port 132, and the protruding flow path 140. The second component 110T has the second outer main surface 111b and the second inner main surface 112b. By constituting the tank 100 with the first component 110S and the second component 110T, the tank 100 can be configured of a small number of components, and the cost can be reduced.

If the height Ha (length along the Z direction) of the protruding flow path 140 is too short with respect to the height Hr (length along the Z direction) of the tank chamber 114, even if the amount of liquid in the tank chamber 114 is relatively large, the gas in the tank chamber 114 may enter the tank chamber outflow hole 130 when the orientation or attitude of the tank 100 is changed so that the second outer main surface 111b faces vertically upward. In addition, if the height Ha of the protruding flow path 140 is too long with respect to the height Hr in the tank chamber 114, even if the amount of liquid in the tank chamber 114 is relatively large, the gas in the tank chamber 114 may enter the tank chamber outflow hole 130 when the orientation or attitude of the tank 100 is changed such that the first outer main surface 111a faces vertically upward. Therefore, for example, the height Ha of the protruding flow path 140 may be 30% or more and 70% or less of the height Hr in the tank chamber 114. When the height Ha of the protruding flow path 140 is about 50% of the height Hr of the inside of the tank chamber 114, the air hardly enters regardless of the attitude in the vertical direction.

When the height (length along the Z direction) of the protruding flow path 140 is 50% of the height (length along the Z direction) in the tank chamber 114, the second end 140b of the protruding flow path 140 is located at the center between the surface (that is, the first inner main surface 112a) of the first component 110S on the tank chamber 114 side and the surface (that is, the second inner main surface 112b) of the second component 110T on the tank chamber 114 side. Since the second end 140b is located at the center of the height of the tank chamber 114, the volume in which the gas can be stored vertically above the flow path inlet 140P increases, and the gas can be suppressed from entering the tank chamber outflow hole 130. In addition, since the length of the protruding flow path 140 is relatively long with respect to the tank chamber 114, it is possible to suppress gas from entering the protruding flow path 140.

In the description with reference to FIGS. 1 to 2B, the housing 110 has the tank chamber 114 having a substantially rectangular parallelepiped shape, but the present example embodiment is not limited thereto. It is preferable that the housing 110 is configured to further suppress the outflow of the gas from the tank 100. Since the liquid flows from the flow path inlet 140P to the protruding flow path 140, the housing 110 regulates the flow around the flow path inlet 140P, so that it is possible to suppress the gas from flowing out of the tank 100.

Figure 3A:
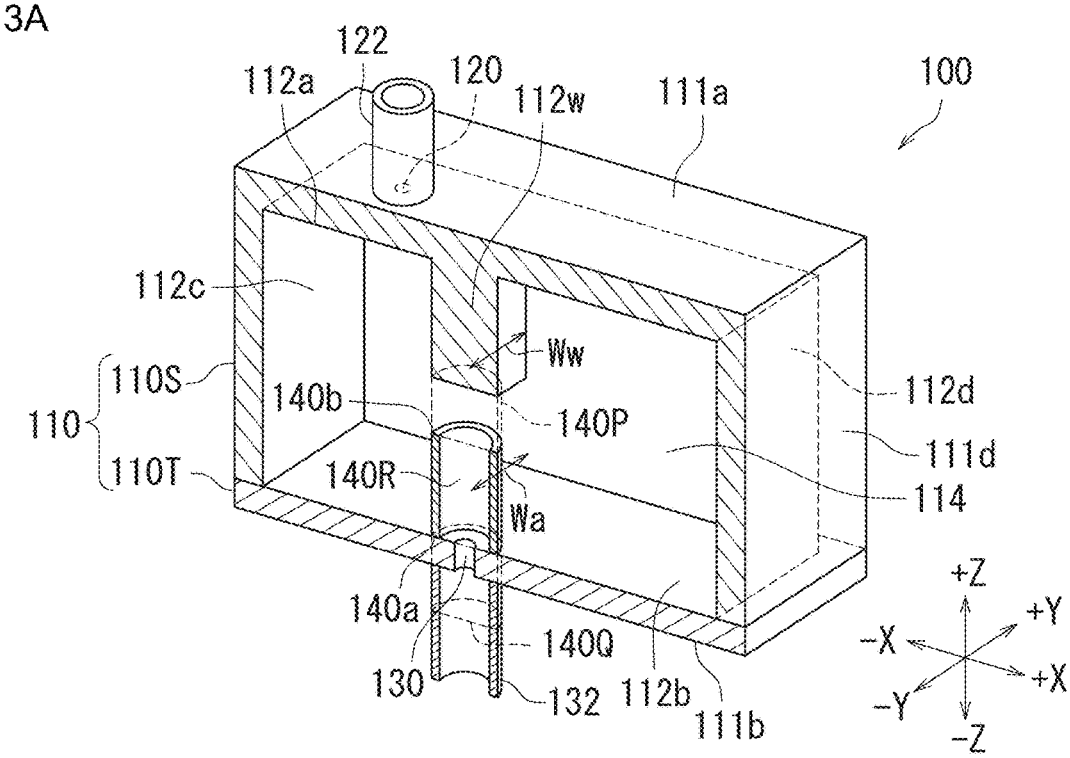
FIG. 3A is a schematic cross-sectional perspective view of a tank of a second example embodiment of the present disclosure.
Figure 3B:
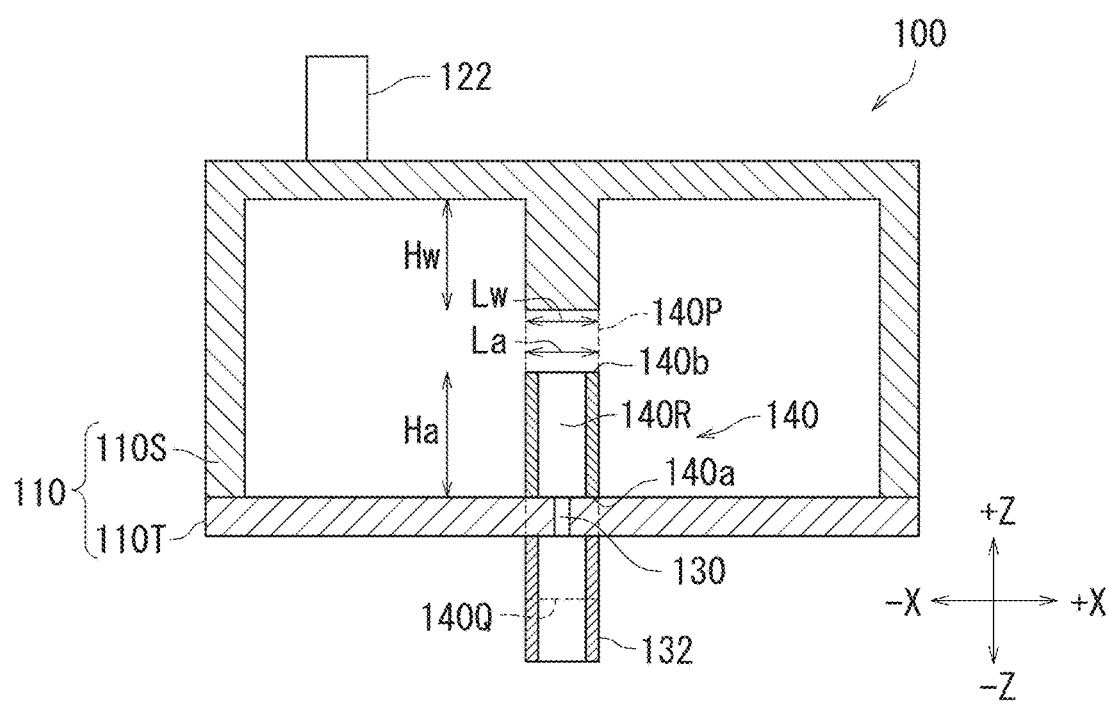
FIG. 3B is a schematic cross-sectional view of the tank of the second example embodiment.

Next, a tank 100 of a second example embodiment will be described with reference to FIGS. 3A and 3B. FIG. 3A is a schematic cross-sectional perspective view of the tank 100 of the second example embodiment, and FIG. 3B is a schematic cross-sectional view of the tank 100 of the second example embodiment. The tank 100 of the second example embodiment shown in FIGS. 3A and 3B has a configuration similar to that of the tank 100 of the first example embodiment shown in FIGS. 2A and 2B except that the housing 110 has a protruding wall 112w protruding toward the protruding flow path 140, and redundant description is omitted for the purpose of avoiding redundancy. Even in this example, the outer peripheral surface and the inner peripheral surface of the protruding flow path 140 each have a cylindrical shape. However, the protruding flow path 140 may have a tubular shape, and the outer peripheral surface and the inner peripheral surface of the protruding flow path 140 may each have a rectangular parallelepiped shape. The combination of the outer peripheral surface and the inner peripheral surface of the protruding flow path 140 may be arbitrary.

As shown in FIGS. 3A and 3B, in the tank 100, the housing 110 has the protruding wall 112w protruding toward the protruding flow path 140. The protruding wall 112w partially protrudes in the −Z direction from the first inner main surface 112a. The protruding wall 112w faces the +Z direction side with respect to the protruding flow path 140. The protruding wall 112w restricts the flow of liquid flowing in from the +Z direction side with respect to the flow path inlet 140P. Therefore, it is possible to suppress gas from entering the protruding flow path 140 by the protruding wall 112w in the housing 110.

The length (Lw) of the protruding wall 112w along the X direction is substantially equal to the length (La) of the protruding flow path 140 along the X direction. The length (Ww) of the protruding wall 112w along the Y direction is substantially equal to the length (Wa) of the outer diameter of the protruding flow path 140 along the Y direction.

It is preferable that the length (Hw) of the protruding wall 112w along the Z direction and the length (Ha) of the protruding flow path 140 along the Z direction are designed such that the flow path inlet 140P is positioned at the center of the height Hr of the tank chamber 114. For example, the length (Hw) of the protruding wall 112w along the Z direction may be substantially equal to the length (Ha) of the protruding flow path 140 along the Z direction.

The protruding flow path 140 includes the flow path inlet 140P into which liquid flows, the flow path outlet 140Q from which liquid flows out, and the first flow path 140R connecting the flow path inlet 140P and the flow path outlet 140Q. Here, the flow path inlet 140P is defined by the second end 140b of the protruding flow path 140 and a surface of the protruding wall 112w facing the protruding flow path 140. The flow path inlet 140P is closed in the straight advancing direction (Z direction) of the protruding flow path 140, and is open in a direction (X direction or Y direction) different from the direction (Z direction) in which the first flow path 140R extends. Therefore, it is possible to suppress the liquid from flowing into the protruding flow path 140 along the extending direction of the protruding flow path 140, and as a result, it is possible to suppress generation of bubbles due to generation of a spiral and a wave in the flow path inlet 140P and to suppress entry of the gas accumulated in the tank into the protruding flow path.

In the description with reference to FIGS. 1 to 3B, the protruding wall 112w extends from the first inner main surface 112a toward the protruding flow path 140, but the present example embodiment is not limited thereto. The protruding wall 112w may extend toward the protruding flow path 140 so as to partially suppress the inflow of liquid into the flow path inlet 140P.

Figure 4A:
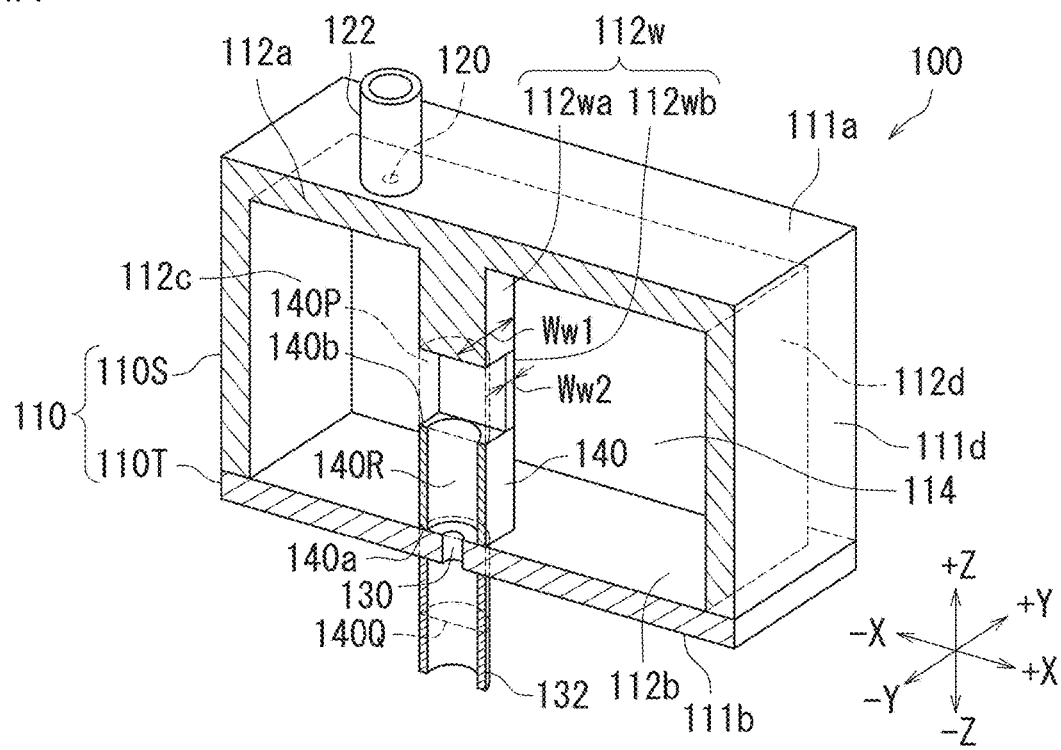
FIG. 4A is a schematic cross-sectional perspective view of a tank of a third example embodiment of the present disclosure.
Figure 4B:
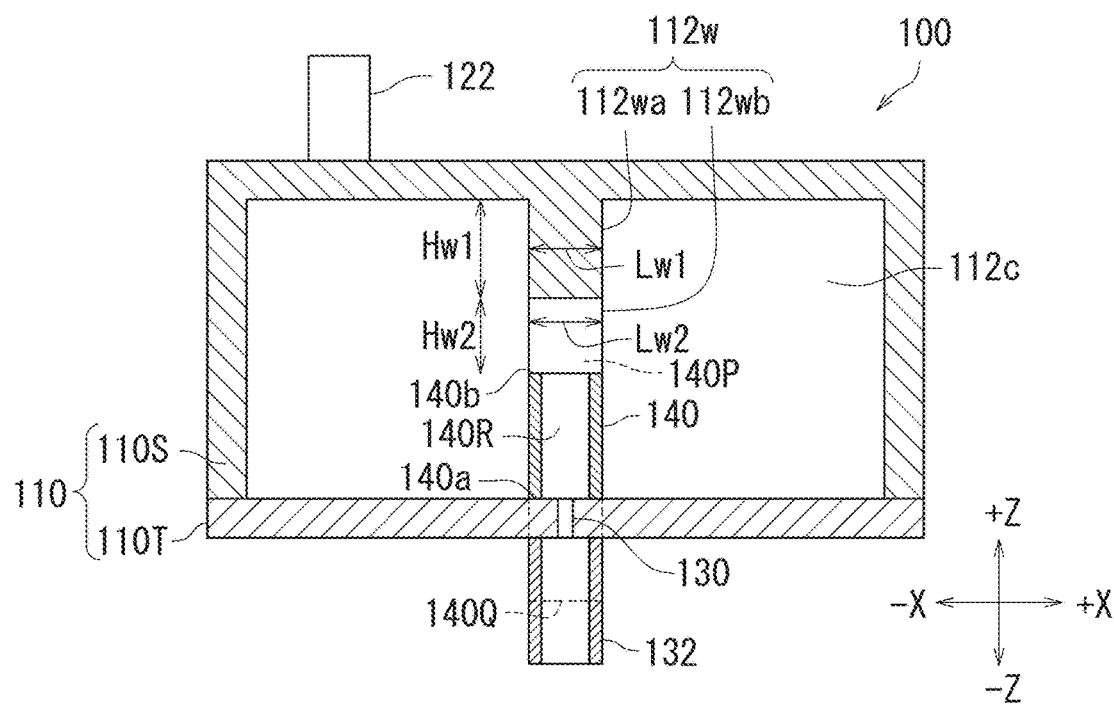
FIG. 4B is a schematic cross-sectional view of the tank of the third example embodiment.

Next, a tank 100 of a third example embodiment will be described with reference to FIGS. 4A and 4B. FIG. 4A is a schematic cross-sectional perspective view of the tank 100 of the third example embodiment, and FIG. 4B is a schematic cross-sectional view of the tank 100 of the third example embodiment. The tank 100 of the third example embodiment shown in FIGS. 4A and 4B has a configuration similar to that of the tank 100 of the second example embodiment shown in FIGS. 3A and 3B except that a part of the protruding wall 112w partially protrudes, and redundant description is omitted in order to avoid redundancy. Even in this example, the outer peripheral surface of the protruding flow path 140 has a rectangular parallelepiped shape, and the inner peripheral surface of the protruding flow path 140 has a cylindrical shape. However, the combination of the outer peripheral surface and the inner peripheral surface of the protruding flow path 140 may be arbitrary.

As shown in FIGS. 4A and 4B, in the tank 100 of the third example embodiment, the housing 110 has the protruding wall 112w. The protruding wall 112w has a main body 112wa and a protrusion 112wb. The main body 112wa partially protrudes in the −Z direction from the first inner main surface 112a. The main body 112wa faces the +Z direction side with respect to the protruding flow path 140. The main body 112wa restricts the flow of liquid flowing in from the +Z direction side with respect to the flow path inlet 140P.

The protrusion 112wb partially protrudes from the surface of the main body 112wa on the protruding flow path 140 side toward the protruding flow path 140. The protrusion 112wb partially protrudes in the −Z direction from an end on the +Y direction side of a surface of the main body 112wa facing the protruding flow path 140. Further, the protrusion 112wb partially protrudes in the −Z direction from an end on the −Y direction side of a surface of the main body 112wa facing the protruding flow path 140. FIGS. 4A and 4B illustrate the protrusion 112wb extending from an end on the +Y direction-side of the surface of the main body 112wa facing the protruding flow path 140 toward the flow path inlet 140P of the protruding flow path 140. However, the protrusion 112wb also extends from an end on the −Y direction-side of the surface of the main body 112wa facing the protruding flow path 140 toward the flow path inlet 140P of the protruding flow path 140. The protrusion 112wb connects the main body 112wa and the protruding flow path 140. The protrusion 112wb can prevent gas from entering the protruding flow path 140.

The length (Lw2) of the protrusion 112wb along the X direction is substantially equal to the length (Lw1) of the main body 112wa along the X direction. The length (Ww2) of the protrusion 112wb along the Y direction is shorter than the length (Ww1) of the main body 112wa along the Y direction.

For example, it is preferable that the length (Hw2) of the protrusion 112wb along the Z direction is shorter than the length (Hw1) along the main body 112wa. However, the length (Hw2) of the protrusion 112wb along the Z direction may be substantially equal to the length (Hw1) along the main body 112wa.

Here, the flow path inlet 140P is defined by the second end 140b, the surface of the protruding wall 112w on the protruding flow path 140 side, and the protrusion 112wb. The flow path inlet 140P is closed in the short direction (Y direction) of the tank chamber 114 and the straight advancing direction (Z direction) of the protruding flow path 140. On the other hand, the flow path inlet 140P is open in the longitudinal direction (X direction) of the tank chamber 114.

Therefore, it is possible to suppress the liquid from staying in the tank chamber 114 by the protrusion 112wb.

In the tank 100 shown in FIGS. 2A to 4B, the flow path inlet 140P is located on the +Z direction side of the protruding flow path 140, but the flow path inlet 140P may be located at a position different from the +Z direction side of the protruding flow path 140.

Figure 5A:
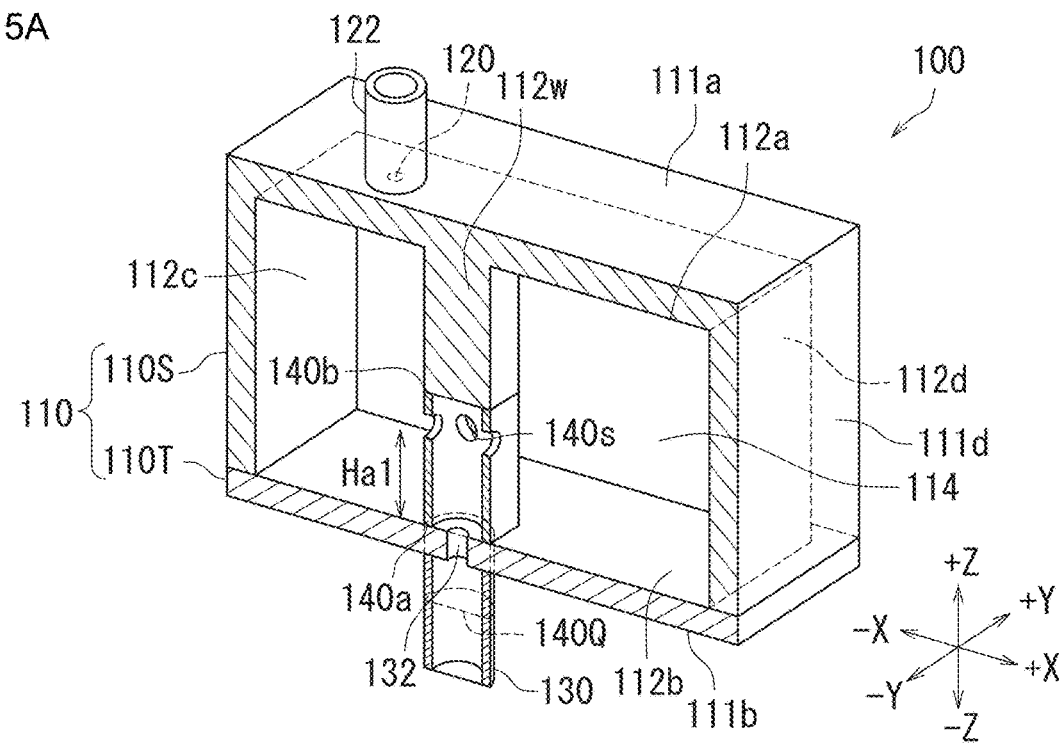
FIG. 5A is a schematic cross-sectional perspective view of a tank of a fourth example embodiment of the present disclosure.
Figure 5B:
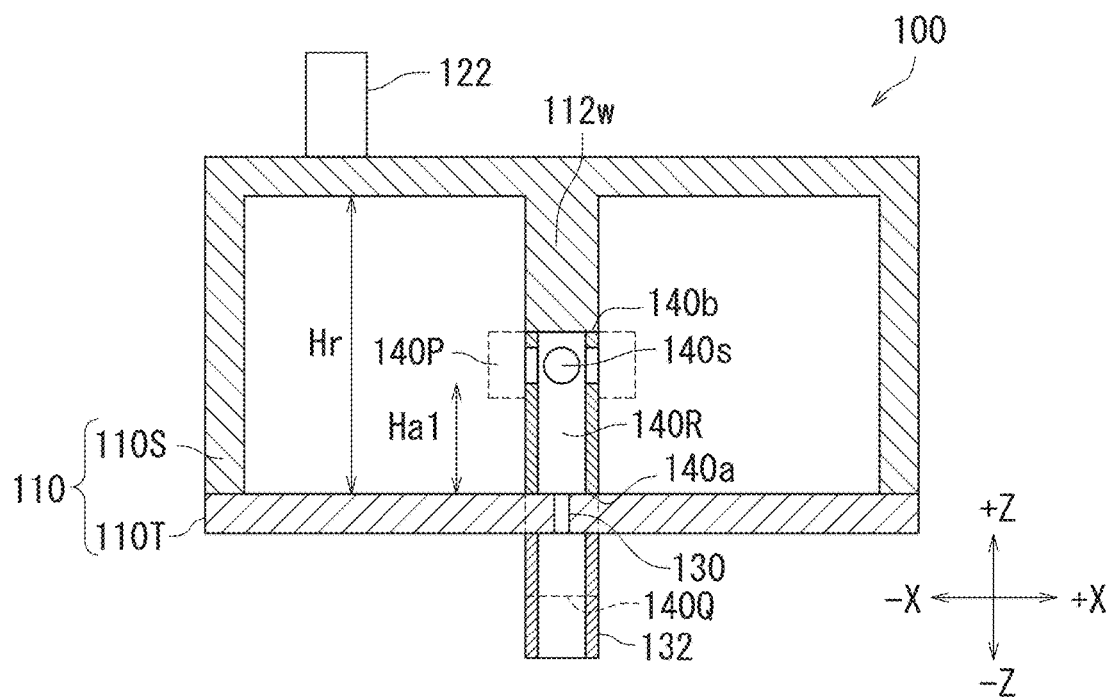
FIG. 5B is a schematic cross-sectional view of the tank of the fourth example embodiment.

Next, a tank 100 of a fourth example embodiment will be described with reference to FIGS. 5A and 5B. FIG. 5A is a schematic cross-sectional perspective view of the tank 100 of the fourth example embodiment, and FIG. 5B is a schematic cross-sectional view of the tank 100 of the fourth example embodiment. The tank 100 of the fourth example embodiment shown in FIGS. 5A and 5B has a configuration similar to that of the tank 100 of the second example embodiment shown in FIGS. 3A and 3B except that the protruding flow path 140 has a through hole 140s and the protruding wall 112w covers the second end 140b of the protruding flow path 140, and redundant description is omitted in order to avoid redundancy. The outer peripheral surface and the inner peripheral surface of the protruding flow path 140 each have a rectangular parallelepiped shape. However, the protruding flow path 140 may have a tubular shape, and the outer peripheral surface and the inner peripheral surface of the protruding flow path 140 may each have a cylindrical shape. The combination of the outer peripheral surface and the inner peripheral surface of the protruding flow path 140 may be arbitrary.

As shown in FIGS. 5A and 5B, the protruding flow path 140 has the through hole 140s that connects the inside of protruding flow path 140 and the outside of the protruding flow path 140. The through hole 140s penetrates the side of the protruding flow path 140. Here, the through hole 140s is located on the second end 140b side of the protruding flow path 140 extending in the Z direction.

The height Hal of the through hole 140s with respect to the height Hr in the tank chamber 114 (the length along the Z direction from the second inner main surface 112b to the through hole 140s) may be 30% or more and 70% or less. When the height Hal of the through hole 140s is about 50% of the height Hr in the tank chamber 114, the air hardly enters regardless of the attitude in the vertical direction.

The protruding flow path 140 has a tubular shape, and the outer peripheral surface and the inner peripheral surface of the protruding flow path 140 each have a substantially rectangular parallelepiped shape. The through hole 140s is located on each of a surface on the +X direction side, a surface on the −X direction side, a surface on the +Y direction side, and a surface on the −Y direction side of the protruding flow path 140.

In addition, here, the protruding flow path 140 is in contact with the protruding wall 112w. Specifically, the opening of the second end 140b of the protruding flow path 140 is covered with the protruding wall 112w. Therefore, since the liquid flows into the inside of the protruding flow path 140 from the side of the protruding flow path 140 via the through hole 140s, it is possible to suppress the gas from entering the tank chamber outflow hole 130.

As described above, the opening of the second end 140b of the protruding flow path 140 is covered with the protruding wall 112w. Therefore, the flow path inlet 140P into which liquid flowing through the protruding flow path 140 flows is defined around the through hole 140s.

The protruding flow path 140 includes the flow path inlet 140P into which liquid flows, the flow path outlet 140Q from which liquid flows out, and the first flow path 140R connecting the flow path inlet 140P and the flow path outlet 140Q. The flow path inlet 140P faces a direction different from the direction (Z direction) in which the first flow path 140R extends. By suppressing the liquid from flowing in along the direction in which the protruding flow path 140 extends, it is possible to suppress generation of bubbles in the liquid due to generation of a spiral and a wave in the flow path inlet 140P.

In FIGS. 5A and 5B, the through hole 140s is located on each of the surface on the +X direction side, the surface on the −X direction side, the surface on the +Y direction side, and the surface on the −Y direction side of the protruding flow path 140, but the present example embodiment is not limited thereto. The through hole 140s may be located on any surface of the protruding flow path 140. However, it is preferable that the through hole 140s is located along the longitudinal direction of the tank chamber 114. For example, when the tank chamber 114 extends along the X direction, it is preferable that the through hole 140s is located on the surface on the +X direction side and the surface on the −X direction side of the protruding flow path 140. This makes it possible to suppress entry of gas into the protruding flow path 140 regardless of the orientation or attitude of the tank 100, and to suppress outflow of gas from the tank chamber outflow hole 130.

In FIGS. 5A and 5B, the protruding wall 112w of the housing 110 comes into contact with the second end 140b of the protruding flow path 140 and covers the second end 140b of the protruding flow path 140, but the present example embodiment is not limited thereto. The protruding wall 112w may not be in contact with the second end 140b of the protruding flow path 140, and the protruding flow path 140 may be open at the second end 140b of the protruding flow path 140.

The tank 100 of the first to fifth example embodiments is suitably used as a cooler for cooling a heat source. When the tank 100 is used as a cooler, the liquid in the tank 100 functions as so-called refrigerant.

The tank 100 of the first to fifth example embodiments described with reference to FIGS. 1 to 5B may be used in combination with another member. In that case, it is preferable that the liquid flowing out of the tank chamber outflow hole 130 of the tank 100 flows in a direction different from the direction in which the liquid flows through the protruding flow path 140.

Figure 6A:
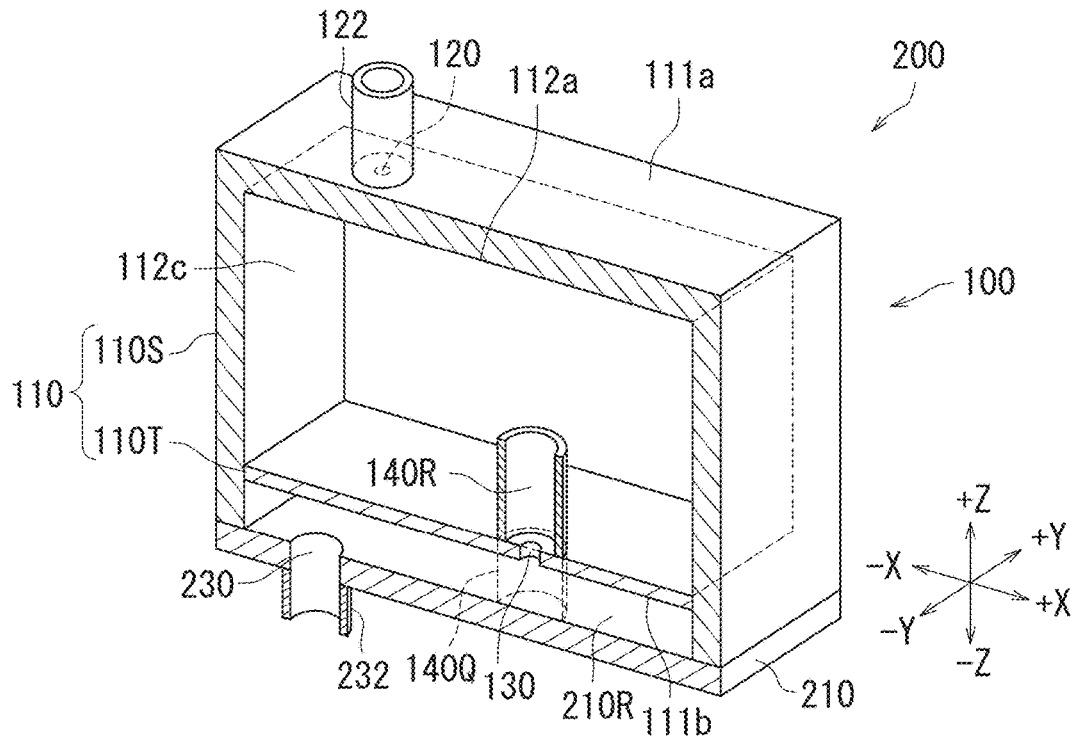
FIG. 6A is a schematic cross-sectional perspective view of a tank of a fifth example embodiment of the present disclosure.

Next, a cooler 200 of a fifth example embodiment will be described with reference to FIG. 6A. FIG. 6A is a schematic cross-sectional perspective view of the cooler 200 of the fifth example embodiment.

The cooler 200 is suitably used for cooling heat generating components. The cooler 200 may cool an electronic device having a heating element inside. The cooler 200 may cool a circuit of an electronic device. Alternatively, the cooler 200 may cool a light source or the like of an electronic device. For example, the electronic device may be any of a server, a workstation, a projector, a laptop computer, and a two-dimensional display device.

As illustrated in FIG. 6A, the cooler 200 includes a tank 100 and a cover 210. The cover 210 is disposed on the tank chamber outflow hole 130 side of the tank 100. The flow path outlet 140Q has the tank chamber outflow hole 130. The cover 210 covers the second outer main surface 111b of the tank 100. The tank 100 may be any of the tanks 100 described above with reference to FIGS. 1 to 5B.

Even in this example, the outer peripheral surface and the inner peripheral surface of the protruding flow path 140 each have a cylindrical shape. However, the protruding flow path 140 may have a tubular shape, and the outer peripheral surface and the inner peripheral surface of the protruding flow path 140 may each have a rectangular parallelepiped shape. The combination of the outer peripheral surface and the inner peripheral surface of the protruding flow path 140 may be arbitrary.

The cover 210 is disposed to face the tank chamber outflow hole 130 of the tank 100. The cover 210 is disposed away from the second outer main surface 111b of the housing 110 by a predetermined distance. The cooler 200 has a predetermined gap between the second outer main surface 111b of the housing 110 and the cover 210. The liquid flowing out of the tank chamber outflow hole 130 of the tank 100 flows along the gap between the second outer main surface 111b of the housing 110 and the cover 210. Therefore, a flow path is formed between the second outer main surface 111b of the housing 110 and the cover 210. In the present specification, a flow path located between the second outer main surface 111b of the housing 110 and the cover 210 may be referred to as a "second flow path 210R".

The first flow path 140R of the protruding flow path 140 extends in the Z direction, whereas the second flow path 210R extends in a direction different from the Z direction. In this example, the second flow path 210R extends in the X direction.

The cover 210 has an outflow hole 230. The outflow hole 230 is located on the −Z direction side with respect to the second flow path 210R.

An attachment port 232 connected to the outflow hole 230 is disposed outside the cover 210. The attachment port 232 is located on the −Z direction side with respect to the cover 210. The attachment port 232 has a cylindrical shape. The attachment port 232 is disposed to surround the outflow hole 230. The inner diameter (length in the XY plane) of the attachment port 232 is larger than the hole diameter (length in the XY plane) of the outflow hole 230. A pipe (not illustrated) through which liquid flows is attached to the attachment port 232.

The outflow hole 230 is disposed at a position different from the tank chamber outflow hole 130. Specifically, in the XY plane, the position of the outflow hole 230 is different from the position of the tank chamber outflow hole 130. Therefore, even if the gas flows out from the tank chamber outflow hole 130, it is possible to suppress the gas flowing out from the tank chamber outflow hole 130 from linearly moving to the outflow hole 230. Therefore, it is possible to suppress a large amount of gas from continuously flowing out from the cooler 200.

At least the tank 100 and the cover 210 constitute the second flow path 210R. The liquid flowing out of the tank chamber outflow hole 130 of the tank 100 flows in the second flow path along a direction different from the direction in which the protruding flow path 140 extends. Since the liquid flowing out of the tank chamber outflow hole 130 of the tank 100 flows in a direction different from the direction in which the protruding flow path 140 extends, it is possible to suppress the gas from linearly moving in a short period according to the change of the attitude of the cooler 200.

The cover 210 may be a cold plate. The cold plate is suitably used for cooling the heat source.

Figure 6B:
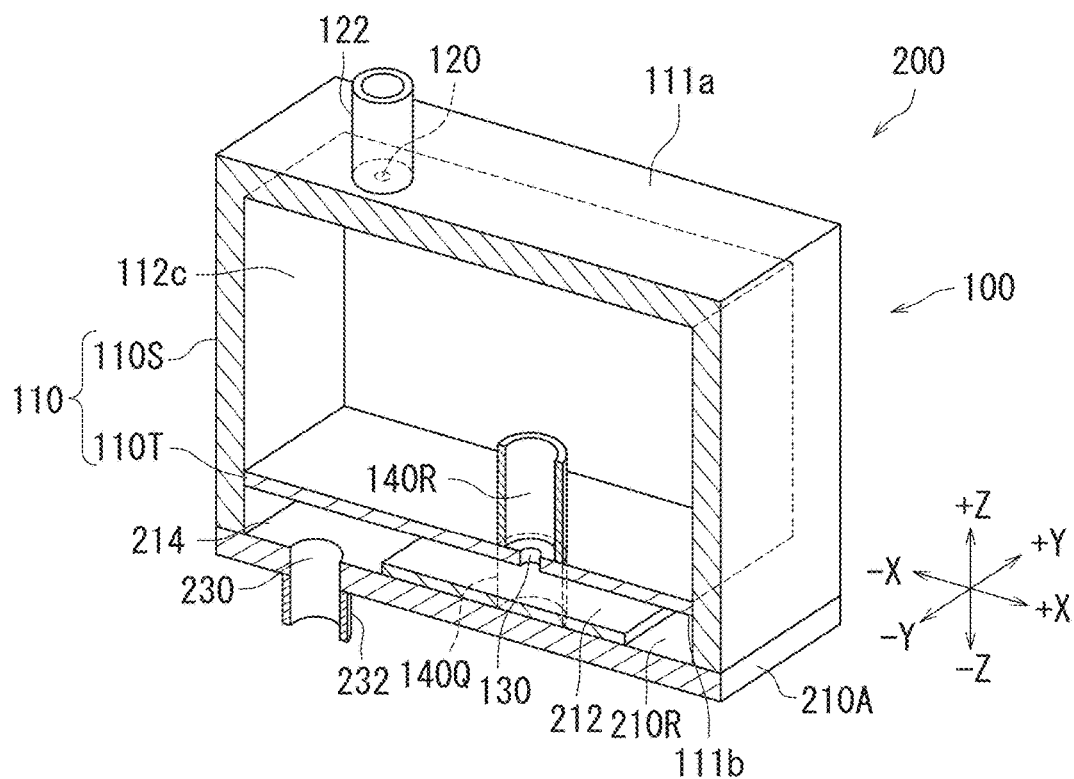
FIG. 6B is a schematic cross-sectional perspective view of a tank of a sixth example embodiment of the present disclosure.

Next, a cooler 200 of a sixth example embodiment will be described with reference to FIG. 6B. FIG. 6B is a schematic cross-sectional view of the cooler 200 of the sixth example embodiment.

As illustrated in FIG. 6B, the cooler 200 includes the tank 100 and a cold plate 210A as the cover 210. The cold plate 210A is disposed on the tank chamber outflow hole 130 side of the tank 100. The cold plate 210A is made of a material having higher thermal conductivity than that of the tank 100. Typically, the cold plate 210A is made of a metal such as copper or aluminum.

The cold plate 210A has fins 212. The fins 212 are disposed on a +Z direction-side surface of the cold plate 210A. The fins 212 are configured by disposing a plurality of plate-shaped protrusions extending in the X direction in parallel. The fins 212 are disposed facing the tank chamber outflow hole 130 of the tank 100.

As described above, the cover 210 includes the cold plate 210A. The heat source is in contact with a −Z direction-side surface of the cold plate 210A. As a result, the heat source can be efficiently cooled using the liquid flowing out of the tank 100.

The second flow path 210R is a heat exchange chamber 214 including the tank 100 and the cold plate 210A. More specifically, the second component 110T and the cold plate 210A constitute the heat exchange chamber 214. The cold plate 210A has the fins 212 facing the tank chamber outflow hole 130 in the heat exchange chamber 214. Therefore, the heat source can be efficiently cooled by the liquid.

Although the cooler 200 of the sixth example embodiment described with reference to FIGS. 6A and 6B includes the tank 100 and the cover 210, the present example embodiment is not limited thereto. The cooler 200 may include the tank 100 together with a pump that circulates the liquid in the tank 100.

Figure 7:
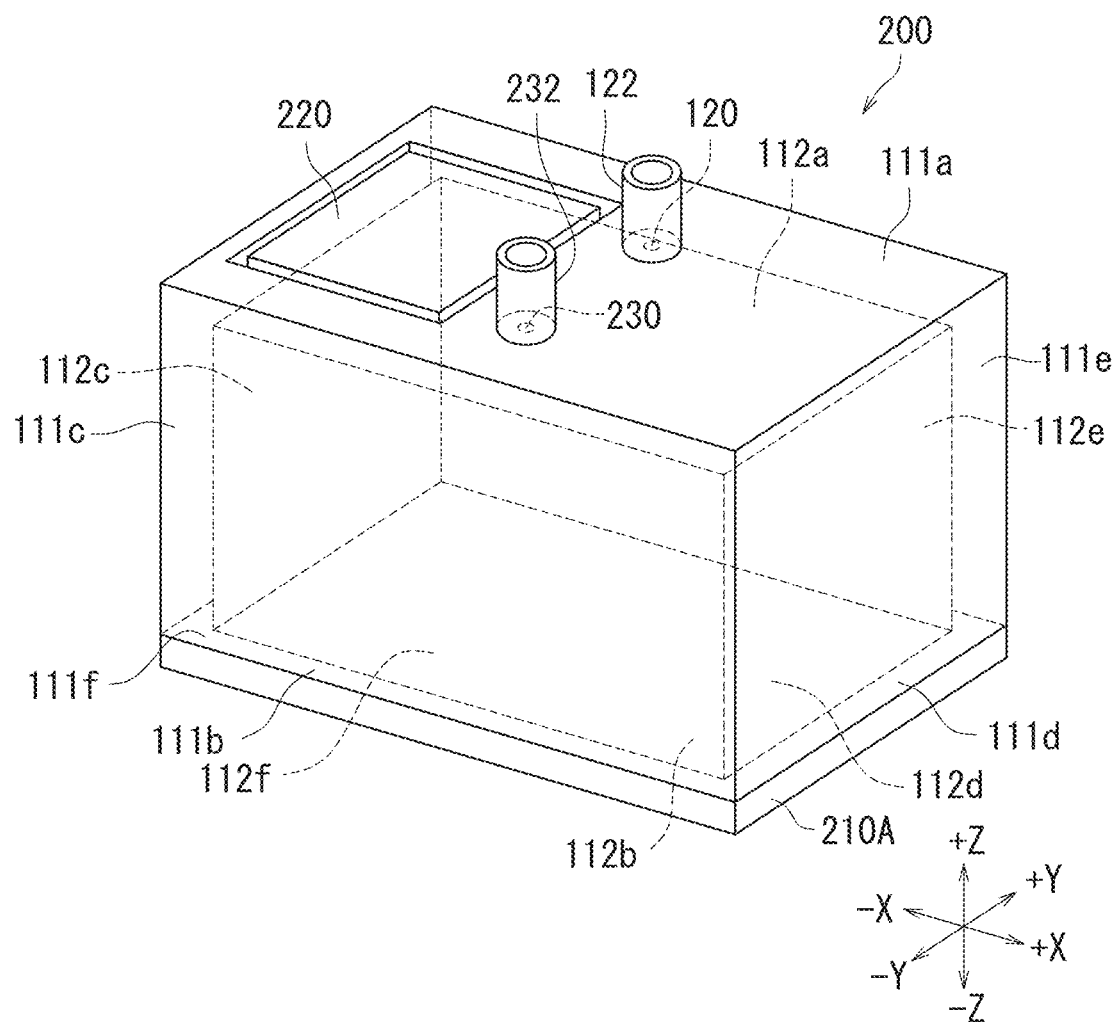
FIG. 7 is a schematic perspective view of a cooler of a seventh example embodiment of the present disclosure.

Next, a cooler 200 of a seventh example embodiment will be described with reference to FIG. 7. FIG. 7 is a schematic perspective view of the cooler 200 of the seventh example embodiment.

As illustrated in FIG. 7, the cooler 200 includes the tank 100, the cold plate 210A, and a pump 220. The cold plate 210A is located on the −Z direction side of the tank 100. The pump 220 is located on the −X direction side of the tank 100. The pump 220 is exposed to the outer surface of the cooler 200.

The liquid flows into the cooler 200 through the tank chamber inflow hole 120. The liquid in the cooler 200 flows out through the outflow hole 230.

In this example, the tank chamber inflow hole 120 is located on the +Z direction side of the housing 110. The outflow hole 230 is located on the +Z direction side of the housing 110. Specifically, the tank chamber inflow hole 120 and the outflow hole 230 are located on the first outer main surface 111a.

The attachment port 232 connected to the outflow hole 230 is disposed outside the housing 110. The attachment port 232 is located on the +Z direction side of the housing 110. The attachment port 232 has a cylindrical shape. The attachment port 232 is disposed to surround the outflow hole 230.

In this example, the liquid flowing in from the tank chamber inflow hole 120 flows into the tank chamber 114. The liquid flowing out of the tank chamber 114 flows out of the outflow hole 230 via the pump 220.

Figure 8:
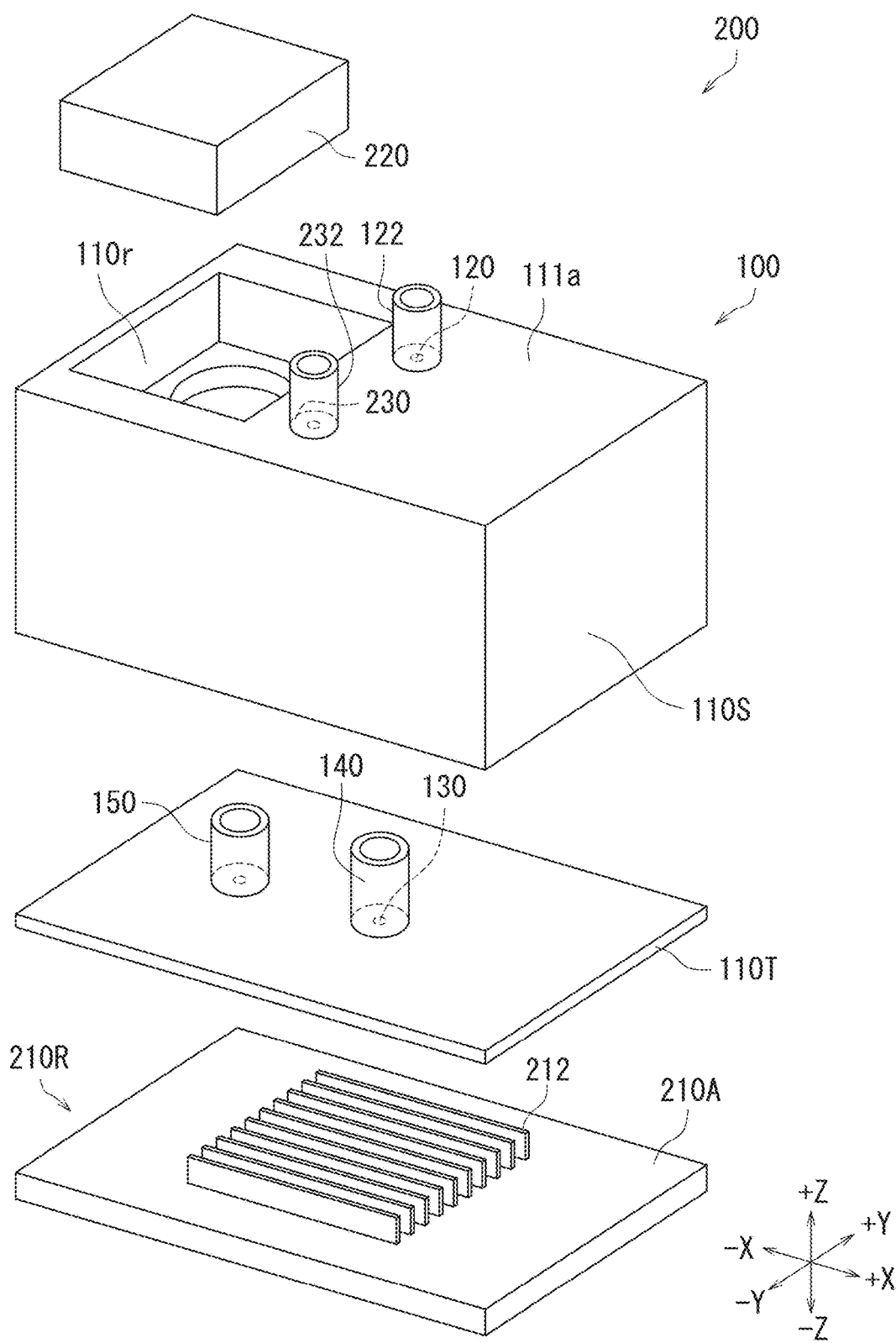
FIG. 8 is a schematic exploded perspective view of the cooler of the seventh example embodiment.

Next, the cooler 200 of the seventh example embodiment will be described with reference to FIG. 8. FIG. 8 is a schematic exploded perspective view of the cooler 200 of the seventh example embodiment.

As illustrated in FIG. 8, the cooler 200 includes the pump 220, the first component 110S, the second component 110T, and the cold plate 210A. The tank 100 includes the first component 110S and the second component 110T. The pump 220 has a fixed part 222 (FIG. 9) and a rotating part 224 (FIG. 9, FIG. 10) that rotates with respect to the fixed part 222. The pump 220 has a motor. The stator of the motor is accommodated in the fixed part. The rotor and the impeller of the motor are integrally formed in the rotating part.

The first component 110S includes the tank chamber inflow hole 120, the inflow attachment port 122, the outflow hole 230, the attachment port 232, and a pump chamber 110r. The pump chamber 110r is provided to be recessed on the first outer main surface 111a. The pump chamber 110r is recessed in a size corresponding to the length (length along the X direction), the width (length along the Y direction), and the height (length along the Z direction) of the pump 220, and the pump 220 is disposed in the pump chamber 110r. More specifically, the impeller is disposed in the pump chamber 110r, and the stator isolated from the pump chamber 110r is disposed in the +Z direction with respect to the pump chamber 110r. The pump chamber 110r is provided with a flow path connected to the outflow hole 230 and a flow path connected to a protruding flow path 150.

The second component 110T has the protruding flow path 140. The second component 110T also has the protruding flow path 150. When the first component 110S and the second component 110T are combined, the protruding flow path 140 is disposed in the tank chamber 114, and the protruding flow path 150 connects the second flow path 210R formed between the cold plate 210A and the second component 110T and the pump chamber 110r.

The cooler 200 further includes the pump 220 connected to the second flow path 210R. The pump 220 can circulate the liquid passing through the tank 100.

Figure 9:
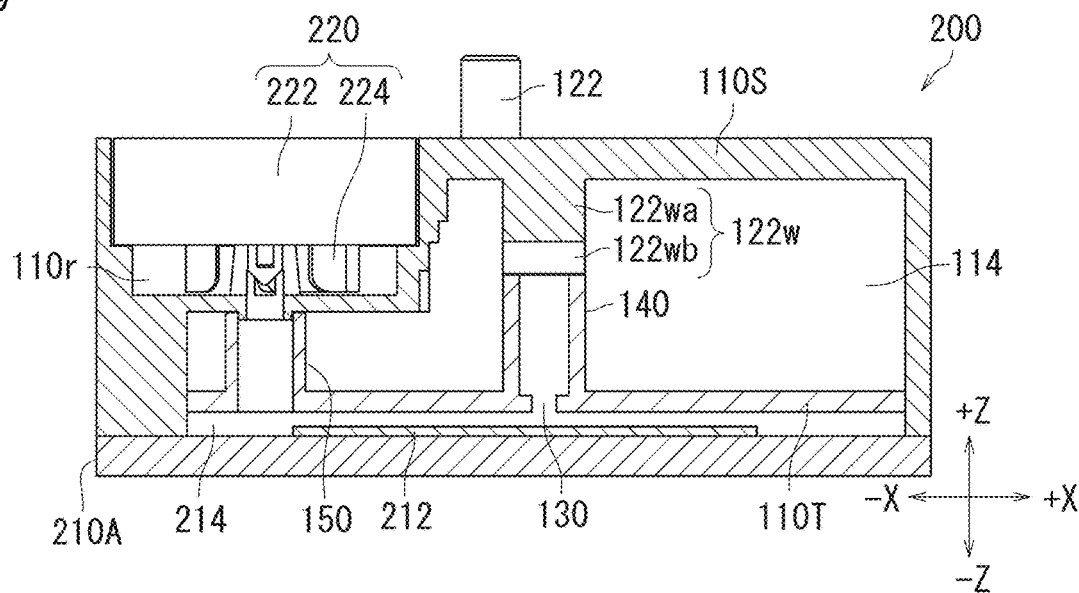
FIG. 9 is a schematic cross-sectional view of the cooler of the seventh example embodiment.
Figure 10:
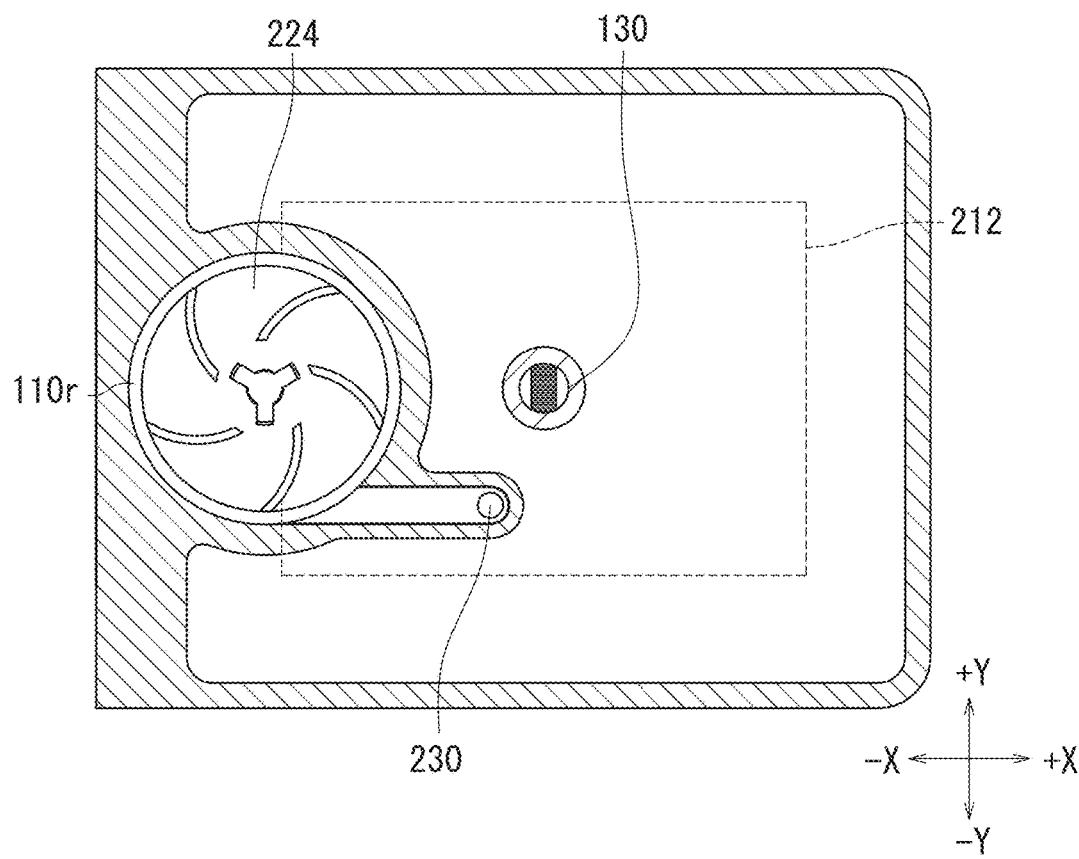
FIG. 10 is a schematic cross-sectional view of the cooler of the seventh example embodiment.

Next, the cooler 200 of the seventh example embodiment will be described with reference to FIGS. 7 to 10. FIG. 9 is a schematic cross-sectional view of the cooler 200 of the seventh example embodiment. FIG. 10 is a schematic cross-sectional view of the cooler 200 of the seventh exemplary example embodiment.

As illustrated in FIG. 9, the pump 220 is disposed in the pump chamber 110r of the first component 110S. More specifically, the impeller is disposed in the pump chamber 110r, and the stator isolated from the pump chamber 110r is disposed in the +Z direction. The liquid flowing into the tank chamber 114 from the tank chamber inflow hole 120 of the tank 100 flows through the protruding flow path 140, the tank chamber outflow hole 130, the heat exchange chamber 214, and the pump chamber 110r in this order, and flows out from the outflow hole 230. Since the liquid flowing out of the tank chamber 114 after flowing into the tank chamber 114 from the tank chamber inflow hole 120 does not directly flow into the pump chamber 110r, gas can be suppressed from entering the pump chamber 110r.

As illustrated in FIG. 10, in the cooler 200, it is preferable that the tank chamber outflow hole 130 is disposed at a position facing the center of the fin 212. As a result, the liquid can be circulated throughout the cold plate 210A.

The example embodiments of the present disclosure are described above with reference to the drawings. However, the present disclosure is not limited to the above example embodiments, and can be implemented in various aspects without departing from the range of the gist of the present disclosure. Additionally, the plurality of components disclosed in the above example embodiments can be appropriately modified. For example, one component of all components shown in one example embodiment may be added to a component of another example embodiment, or some components of all components shown in one example embodiment may be eliminated from the one example embodiment.

The drawings schematically illustrate each component mainly to facilitate understanding of the disclosure, and thus each illustrated component may be different in thickness, length, number, interval, or the like from actual one for convenience of creating the drawings. The configuration of each component described in the above example embodiments is an example, and is not particularly limited. Thus, it is needless to say that various modifications can be made without substantially departing from the range of effects of the present disclosure.

The present disclosure is suitably used for a tank and a cooler.

Features of the above-described example embodiments and the modifications thereof may be combined appropriately as long as no conflict arises.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A cooler-tank comprising:
   a tank including:
     a housing including a tank chamber;
     a tank chamber inflow hole through which liquid flows into the tank chamber;
     a tank chamber outflow hole through which the liquid flows out from the tank chamber; and
     a protruding flow path that is connected to the tank chamber outflow hole and protrudes into the tank chamber from the tank chamber outflow hole; and
   a cover on a side of the tank chamber outflow hole of the tank; wherein
   at least the tank and the cover define a second flow path; and
   the liquid flowing out of the tank chamber outflow hole of the tank flows in the second flow path along a direction different from a direction in which the protruding flow path extends.

2. The cooler according to claim 1, wherein
   the protruding flow path includes:
   a flow path inlet into which the liquid flows;
   a flow path outlet from which the liquid flows out; and
   a first flow path connecting the flow path inlet and the flow path outlet; and
   the flow path inlet is open in a direction different from a direction in which the first flow path extends.

3. The cooler according to claim 2, wherein the housing includes a protruding wall protruding toward the protruding flow path.

4. The cooler according to claim 3, wherein
   the protruding wall includes:
   a main body; and
   a protrusion partially protruding from a surface of the main body on a side of the protruding flow path toward the protruding flow path.

5. The cooler according to claim 4, wherein
   the protruding flow path includes:
   a first end located on a side of the tank chamber outflow hole; and
   a second end located on a side opposite to the tank chamber outflow hole;
   the flow path inlet is defined by the second end, a surface of the protruding wall on the protruding flow path side, and the protrusion; and
   the flow path inlet is open in a longitudinal direction of the tank chamber.

6. The cooler according to claim 2, wherein
the housing includes:
 a first component; and
 a second component defining the tank chamber together with the first component; and
the second component includes the protruding flow path.

7. The cooler according to claim 6, wherein the flow path inlet is located at a center between a surface of the first component on a tank chamber side and a surface of the second component on a tank chamber side.

8. The cooler according to claim 1, wherein the protruding flow path includes a through hole connecting an inside of the protruding flow path and an outside of the protruding flow path.

9. The cooler according to claim 1, further comprising a pump connected to the second flow path.

10. The cooler according to claim 1, wherein the cover includes a cold plate.

11. The cooler according to claim 10, wherein
the second flow path is a heat exchange chamber including the tank and the cold plate; and
the cold plate includes a fin opposing the tank chamber outflow hole.

12. The cooler according to claim 11, further comprising a pump connected to the second flow path.

13. The cooler according to claim 12, wherein liquid flowing into the tank chamber from the tank chamber inflow hole of the tank flows through the protruding flow path, the tank chamber outflow hole, the heat exchange chamber, and the pump in this order.

* * * * *